United States Patent
Xu et al.

(10) Patent No.: US 8,927,377 B2
(45) Date of Patent: Jan. 6, 2015

(54) METHODS FOR FORMING FINFETS WITH SELF-ALIGNED SOURCE/DRAIN

(71) Applicant: Taiwan Semiconductor Manufacturing Company, Ltd., Hsin-Chu (TW)

(72) Inventors: Jeffrey Junhao Xu, Jhubei (TW); Ziwei Fang, Hsin-Chu (TW); Ying Zhang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 117 days.

(21) Appl. No.: 13/728,837

(22) Filed: Dec. 27, 2012

(65) Prior Publication Data

US 2014/0187011 A1     Jul. 3, 2014

(51) Int. Cl.
*H01L 21/336* (2006.01)
*H01L 29/66* (2006.01)

(52) U.S. Cl.
CPC ................ *H01L 29/66795* (2013.01)
USPC ............................ 438/301; 438/299; 438/300

(58) Field of Classification Search
USPC .................. 438/229, 230, 299, 300, 301, 302
See application file for complete search history.

(56) References Cited

U.S. PATENT DOCUMENTS

| | | | | |
|---|---|---|---|---|
| 8,313,999 | B2 * | 11/2012 | Cappellani et al. | 438/283 |
| 8,362,575 | B2 * | 1/2013 | Kwok et al. | 257/401 |
| 8,664,072 | B2 * | 3/2014 | Scheiper | 438/302 |
| 2008/0265321 | A1 * | 10/2008 | Yu et al. | 257/344 |
| 2011/0147842 | A1 | 6/2011 | Cappellani et al. | |

FOREIGN PATENT DOCUMENTS

KR     20120098843     9/2012

* cited by examiner

*Primary Examiner* — Kevin M Picardat
(74) *Attorney, Agent, or Firm* — Slater & Matsil, L.L.P.

(57) ABSTRACT

A method includes forming a gate stack to cover a middle portion of a semiconductor fin, and doping an exposed portion of the semiconductor fin with an n-type impurity to form an n-type doped region. At least a portion of the middle portion is protected by the gate stack from receiving the n-type impurity. The method further includes etching the n-type doped region using chlorine radicals to form a recess, and performing an epitaxy to re-grow a semiconductor region in the recess.

20 Claims, 11 Drawing Sheets

METHODS FOR FORMING FINFETS WITH SELF-ALIGNED SOURCE/DRAIN

BACKGROUND

In the formation of a Field-Effect Transistor (FinFET), a semiconductor fin is formed first, followed by forming a gate stack on a portion of the semiconductor fin. The exposed end portions of the fin on opposite sides of the gate stack are removed to form recesses. Source and drain regions are then re-grown in the recesses through epitaxy.

The performance of Field-Effect Transistors (FinFETs) is strongly affected by the profiles of source and drain regions, which profiles include, for example, the degree of undercut, which is how much the recesses extend under the gate stack. To maintain a controllable performance, it is desired that the magnitude of the undercuts can be controlled accurately. Furthermore, it is desirable that the undercuts are uniform throughout the same type of FinFETs on the same chip. The undercut control, however, is difficult to achieve. For example, due to the pattern loading effect caused by the pattern density of the exposed fin portions, the undercuts may vary significantly. Controlling the undercuts thus becomes a challenge.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Fin Field-Effect Transistor (FinFET) and the method of forming the same are provided in accordance with various exemplary embodiments. The intermediate stages of forming the FinFET are illustrated. The variations of the embodiments are discussed. Throughout the various views and illustrative embodiments, like reference numbers are used to designate like elements.

Figure 1:
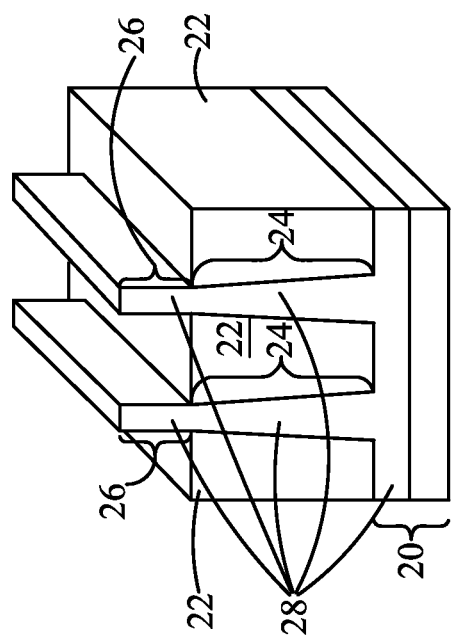
FIGS. 1 through 5B are cross-sectional views and perspective views of intermediate stages in the manufacturing of a Fin Field-Effect Transistor (FinFET) in accordance with some exemplary embodiments.

FIGS. 1 through 5B illustrate perspective views and cross-sectional views in the formation of a FinFET in accordance with exemplary embodiments. FIG. 1 illustrates a perspective view of a structure including substrate 20, isolation regions 22, semiconductor strips 24 between isolation regions 22, and semiconductor fins 26 over the top surface of isolation regions 22. Substrate 20 may be a semiconductor substrate, which may further be a silicon substrate, a silicon carbon substrate, or a substrate formed of other semiconductor materials. Substrate 20 may be lightly doped with a p-type or an n-type impurity.

Isolation regions 22 may be, for example, Shallow Trench Isolation (STI) regions. The formation of STI regions 22 may include etching semiconductor substrate 20 to form trenches (not shown), and filling the trenches with a dielectric material to form STI regions 22. STI regions 22 may comprise silicon oxide, although other dielectric materials such as nitrides may also be used. Semiconductor fins 26 may overlap the underlying semiconductor strips 24. The formation of semiconductor fins 26 may include forming STI regions 22 to have top surfaces level with the top surfaces of semiconductor fins 26, and recessing STI regions 22. The portions of semiconductor material between the removed portions of STI regions 22 thus become semiconductor fins 26. Semiconductor fins 26 and some or substantially entireties of semiconductor strip 24s may comprise substantially pure silicon or other silicon-containing compound including, and not limited to, silicon carbon, silicon germanium, or the like.

In some embodiments, a well doping is performed, for example, through an implantation step, and well region 28 is formed. Well region 28 extends into semiconductor fins 26, and at least top portions of semiconductor strips 24. Well region 28 may also extend into the portions of substrate 20 that are below the bottom surfaces of STI regions 22. If an n-type FinFET is to be formed, well region 28 may be a p-well region comprising a p-type impurity such as boron, indium, or the like. Otherwise, if a p-type FinFET is to be formed, well region 28 may be an n-well region comprising an n-type impurity such as phosphorous, arsenic, antimony, or the like. The doping concentration in well region 28 may be lower than about $1 \times 10^{18}/cm^3$, and may be between about $1 \times 10^{16}/cm^3$, and about $1 \times 10^{18}/cm^3$. In alternative embodiments, the well doping is not performed. In these embodiments, semiconductor fins 26 and semiconductor strips 24 may be intrinsic, which means that they are not doped with p-type and n-type impurities.

Figure 2A:
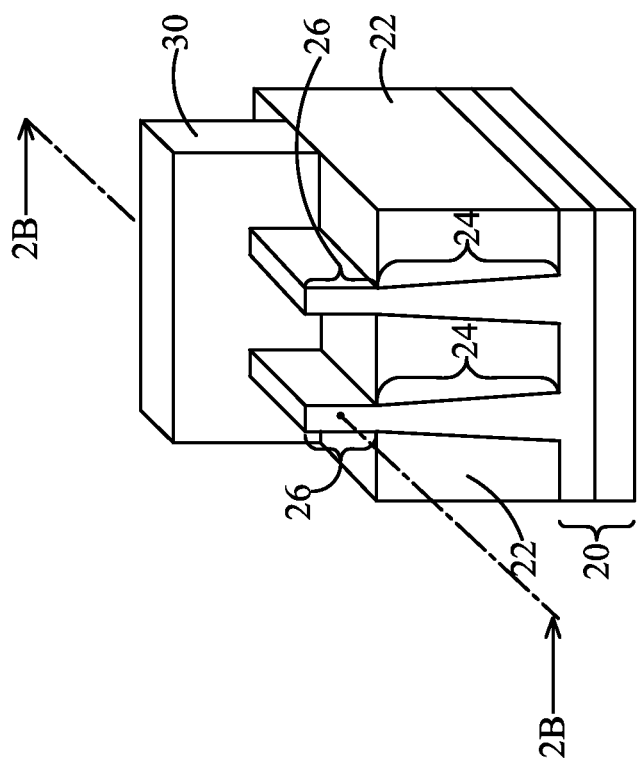
Figure 2B:
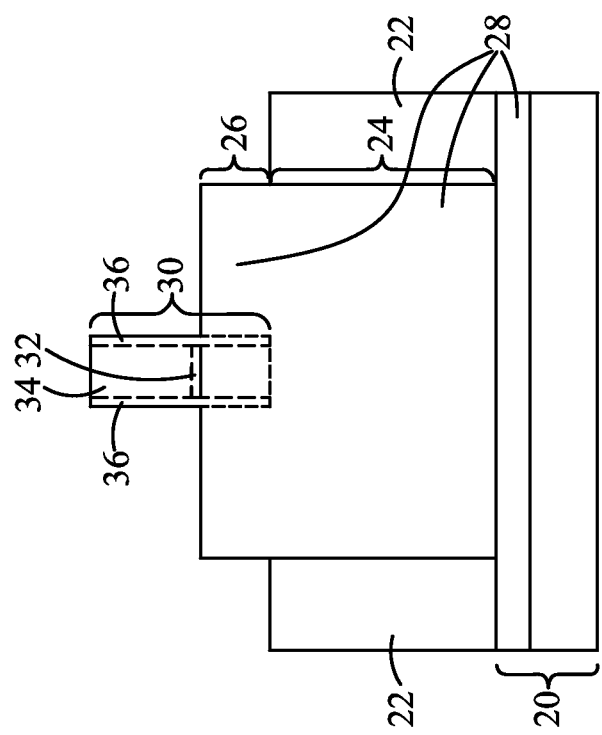

FIGS. 2A and 2B illustrate a perspective view and a cross-sectional view, respectively, in the formation of gate stack 30. The view shown in FIG. 2B is obtained from the plane crossing line 2B-2B in FIG. 2A. Gate stack 30 covers the middle portions of semiconductor fins 26, and leaving the end portions of semiconductor fins 26 uncovered. Furthermore, gate stack 30 is formed on the sidewalls and the top surfaces of the middle portions of semiconductor fins 26.

In some embodiments, gate stack 30 remains in the final FinFET, and forms the gate stack of the final FinFET. In these embodiments, the respective gate stack 30 (FIGS. 2B and 3B) includes gate dielectric 32 on the sidewalls and the top surfaces of semiconductor fins 26, and gate electrode 34 on gate dielectric 32. Gate dielectric 32 may be selected from silicon oxide, silicon nitride, gallium oxide, aluminum oxide, scandium oxide, zirconium oxide, lanthanum oxide, hafnium oxide, combinations thereof, and multi-layers thereof. Gate electrode 34 may include a conductive material that includes polysilicon, a refractory metal or the respective compound including, e.g., Ti, W, TiAl, TaC, TaCN, TaAlC, TaAlCN, TiN, and TiW. In other examples, gate electrode 34 includes nickel (Ni), gold (Au), copper (Cu), or the alloys thereof.

In alternative embodiments, gate stack 30 forms a dummy gate stack that will be replaced by a replacement gate in subsequent steps. Accordingly, gate stack 30 may include dummy gate electrode (which is also denoted as 34), which may comprise polysilicon, for example. Dummy gate dielectric 32 may, or may not, be formed between dummy gate electrode 34 and semiconductor fins 26. Gate spacers 36 may or may not be formed as parts of gate stack 30 in these embodiments.

Figure 3A:
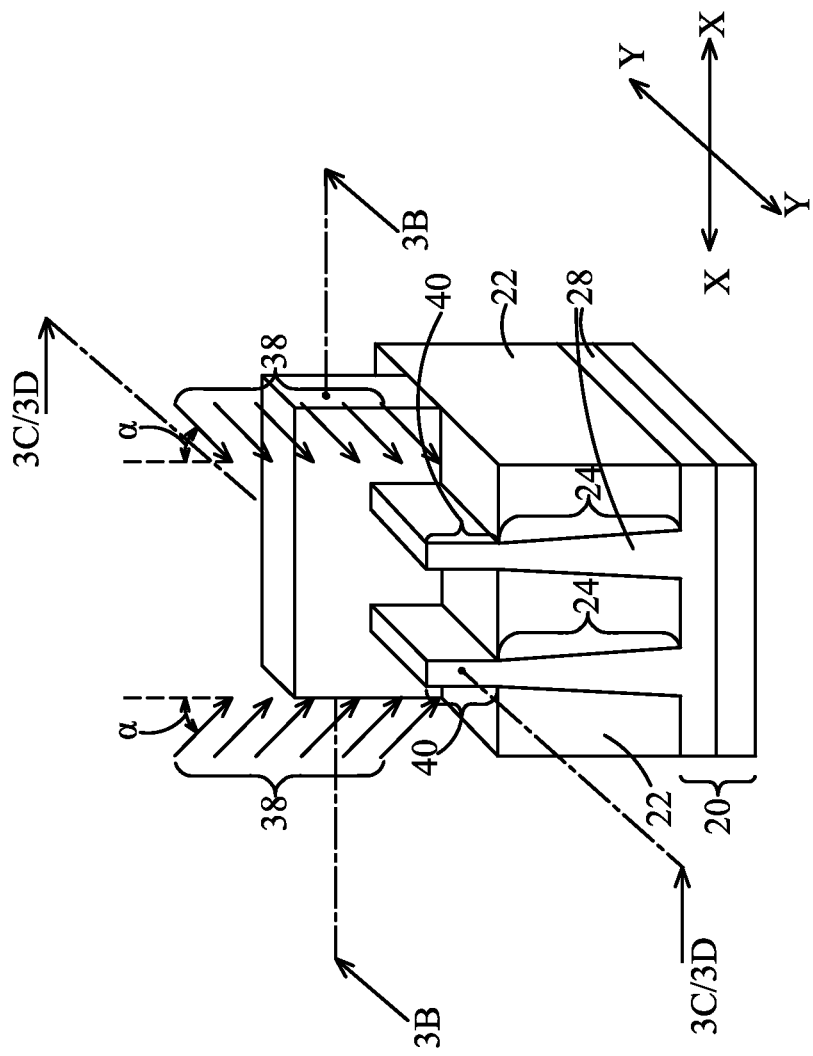
Figure 3B:
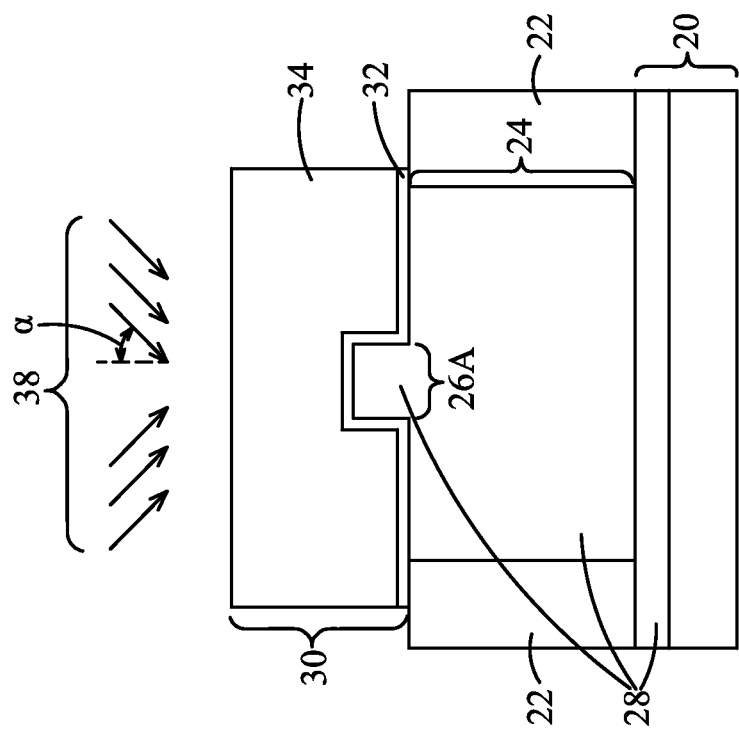
Figure 3C:
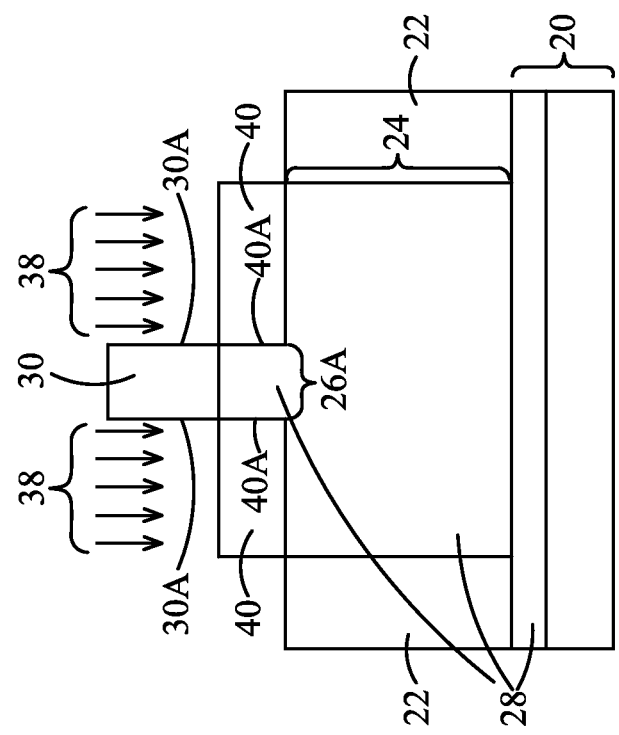
Figure 3D:
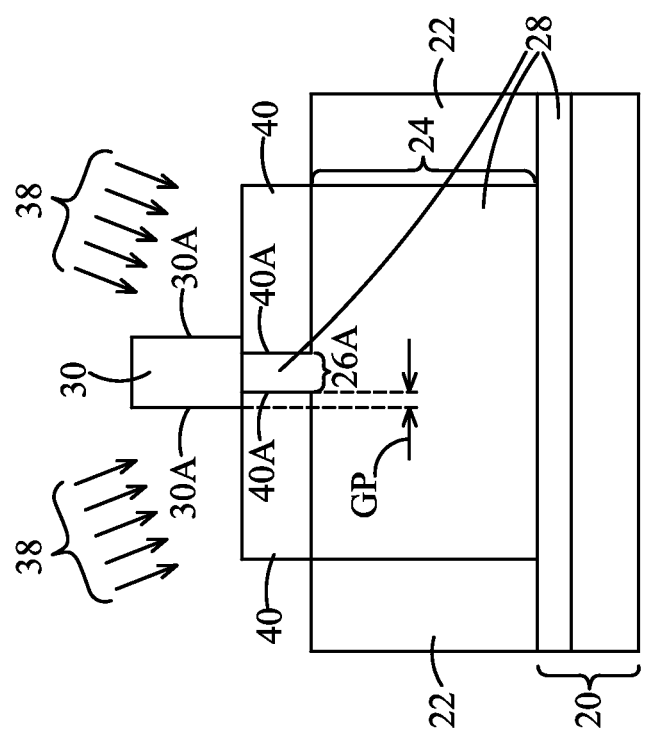

Next, referring to FIGS. 3A, 3B, 3C, and 3D, an n-type doping step is performed to implant an n-type impurity. The view shown in FIG. 3B is obtained from the plane crossing line 3B-3B in FIG. 3A, and the views shown in FIGS. 3C and 3D are obtained from the planes crossing line 3C/3D-3C/3D in FIG. 3A. In accordance with some embodiments, the n-type doping step is performed through an implantation, wherein arrows 38 represent the implanted impurities and the respective implantation. As shown in FIG. 3A, the implantation may include at least two tilted implantations tilted in opposite directions, wherein the tilt angle α may be between about 10 degrees and about 50 degrees, although tilt angle α may be greater or smaller. As a result, the portions of semiconductor fins 26 (FIG. 2A) that are implanted form implanted regions 40 (referred to as n-type doped regions 40 hereinafter). Implanted regions 40 include exposed portions of semiconductor fins 26, and may, or may not, extend substantially into the underlying semiconductor strips 24, depending on the energy used in the implantation. The implanted n-type impurity comprises arsenic, phosphorous, antimony, or the like, although other n-type impurities such as nitrogen may also be used. After the implantation, the n-type impurity concentration in n-type doped regions 40 may be greater than about $5 \times 10^{19}/cm^3$.

Referring to FIG. 3B, in the vertical plane parallel to the longitudinal direction (the illustrated X direction in FIG. 3A) of gate stack 30, implantation 38 includes two implants tilted in opposite directions, so that the entirety of the exposed portions of fins 26 (FIG. 2A) are doped with the n-type impurity, with the doping concentration throughout n-type doped regions 40 being substantially uniform.

FIG. 3C illustrates the embodiments that n-type doped regions 40 do not extend under gate stack 30. In these embodiments, implantation 38 is substantially vertical, and is parallel to the planes in which the edges 30A of gate stack 30 are located. Accordingly, edges 40A of n-type doped regions 40 are aligned to edges 30A of gate stack 30. In these embodiments, two tilted implantations may be used to form the profile of n-type doped regions 40, although more tilted implantations may be performed.

In alternative embodiments, as shown in FIG. 3D, implanted impurities 38 are not parallel to vertical edges 30A of gate stack 30. Accordingly, combining FIGS. 3B and 3D, four tilted implantations may be used to form the profile of n-type doped regions 40 in FIG. 3D, although more tilted implantations may be performed. Each of the four tilted implantations tilts to a direction different from the other three implantations. With the tilted implantations not parallel to vertical edges 30A of gate stack 30, n-type doped regions 40 extend under gate stack 30. The extending distance GP, which is referred to as a gate proximity, may be accurately controlled by controlling the energy and the tilt angle β, wherein tilt angle β is the tilt angle of implanted impurities tilted from the vertical planes in which edges 30A are located. In some embodiments, tilt angle β is between about 10 degrees and about 50 degrees.

In alternative embodiments, instead of implantation, the n-type doping is performed through a conformal doping step, which may include forming a conformal layer (not shown) of an n-type impurity (such as arsenic) on semiconductor fins 26 by generating (arsenic) plasma, forming a capping layer over the n-type impurity, and performing an annealing to drive the n-type impurity into semiconductor fins 26.

Figure 4A:
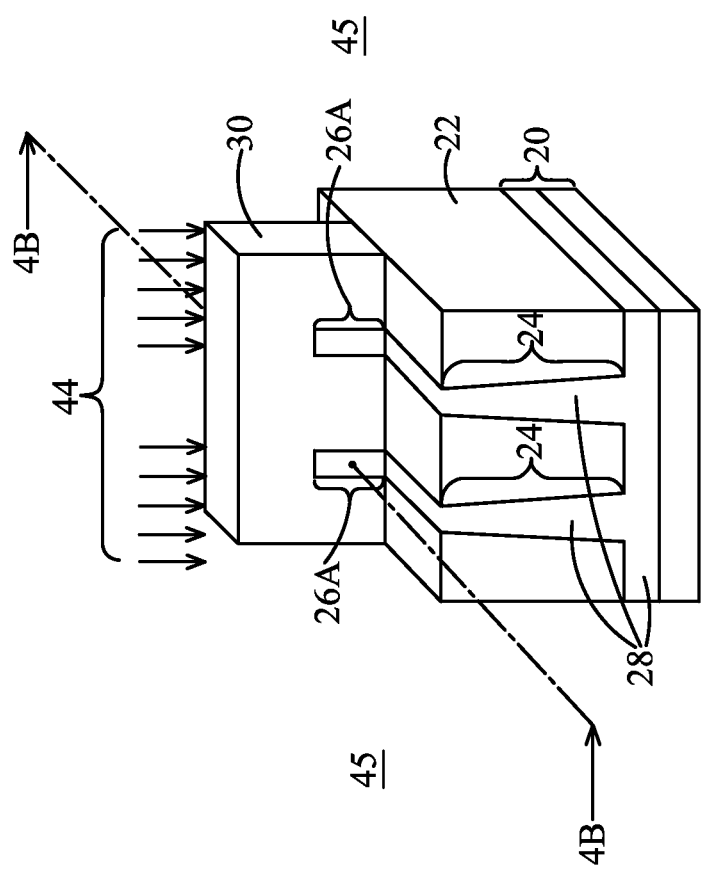
Figure 4B:
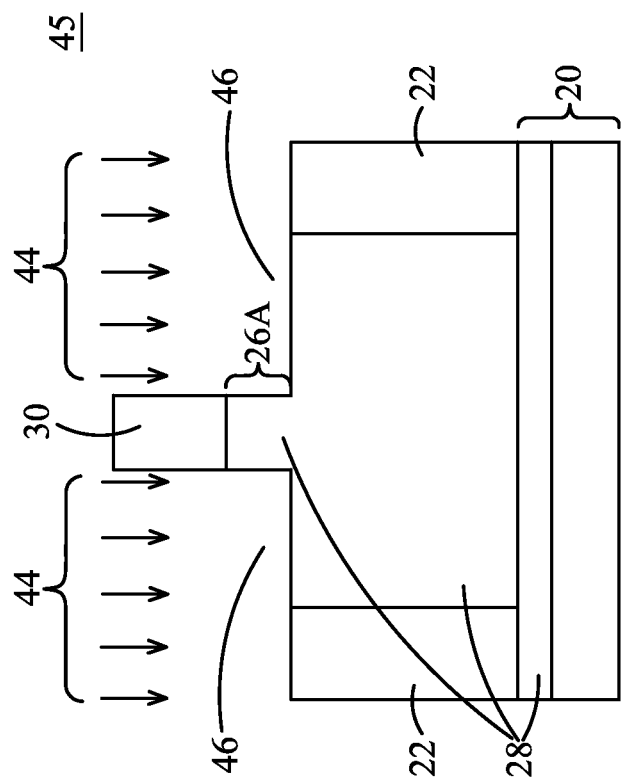

FIGS. 4A and 4B illustrate the etching of n-type doped regions 40. The view shown in FIG. 4B is obtained from the plane crossing line 4B-4B in FIG. 4A. The space left by the removed n-type doped regions 40 are referred to as recesses 46 (FIG. 4B) hereinafter. The etching may be performed in environment 45 (such as a vacuum chamber) in which radicals may exist. Arrows 44 represent chlorine (Cl) radicals, which are chlorine atoms without positive and negative charges. Chlorine radicals are used for the etching of n-type doped regions 40. Chlorine radicals 44 may not be biased, and hence may not be uni-directional, although they are illustrated as directional arrows. In some embodiments, chlorine radicals 44 are generated through the generation of chlorine plasma, which may be filtered to filter out chlorine ions, and leave chlorine radicals in the vacuum chamber for the etching of n-type doped regions 40. In alternative embodiments, besides chlorine radicals 44, chlorine ions (co may also be used for the etching of n-type doped regions 40. In these embodiments, chlorine ions are not filtered from the chlorine plasma.

During the etching of n-type doped regions 40, chlorine radicals 44 may penetrate into and attack the n-type doped regions 40 (FIG. 3A), so that n-type doped regions 40 are etched. Chlorine radicals 44 has the characteristic of forming a passivation at the surface of an un-doped (neutral) silicon or the surface of a p-type doped silicon, so that the chlorine radicals cannot penetrate through the surface of the un-doped silicon or the p-type doped silicon. Hence, chlorine radicals do not etch the un-doped silicon and the p-type doped silicon. Accordingly, referring to FIG. 4B, when p-well region 28 is of p-type, fin portions 26A are of p-type, and hence fin portions 26A are not etched. When p-well region 28 is of n-type, fin portions 26A are also of n-type. since the n-well doping concentration in fin portions 26A is low, the etching rate is also low, which may be smaller than about one mono layer of silicon per ten seconds or slower, depending on the n-type doping concentration in fin portions 26A. Accordingly, the removed portions of fin portions 26A, if removed at all in the etching, may be less than several mono layers or even less than one mono layer. Accordingly, fin portions 26A are substantially un-etched, and can be used as the etch stop layer in the etching of n-type regions 40. The respective etching of n-type doped regions 40 is thus self-aligned to where impurities 38 (FIG. 3A) are doped. Hence, through the accurate control of the n-type doping as in FIGS. 3A through 3D, the profile of fin portions 26A may be controlled accurately, sometimes to an accuracy of one mono layer of silicon.

Experiment results indicated that with the doping concentration in well region 28 being lower than about $1 \times 10^{18}/cm^3$, and n-type doped regions 40 having doping concentrations greater than about $5 \times 10^{19}/cm^3$, the subsequent etching of n-type doped regions 40 (FIGS. 3A and 3B) is fast enough, while fin portions 26A have very small etching rate. This enables the etching of n-type doped regions 40 without etching fin portions 26A.

Figure 5A:
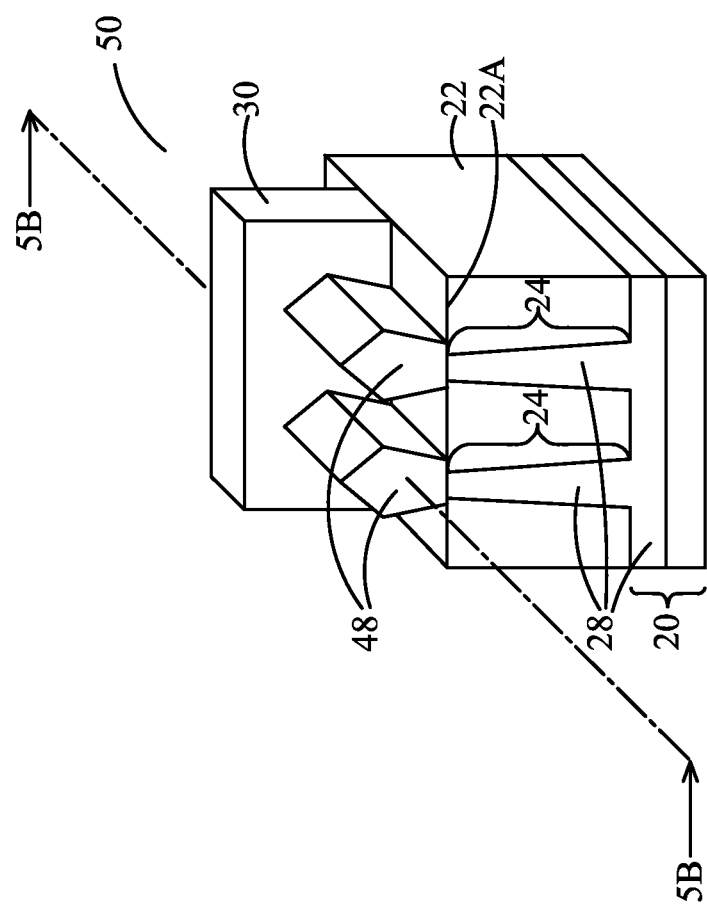
Figure 5B:
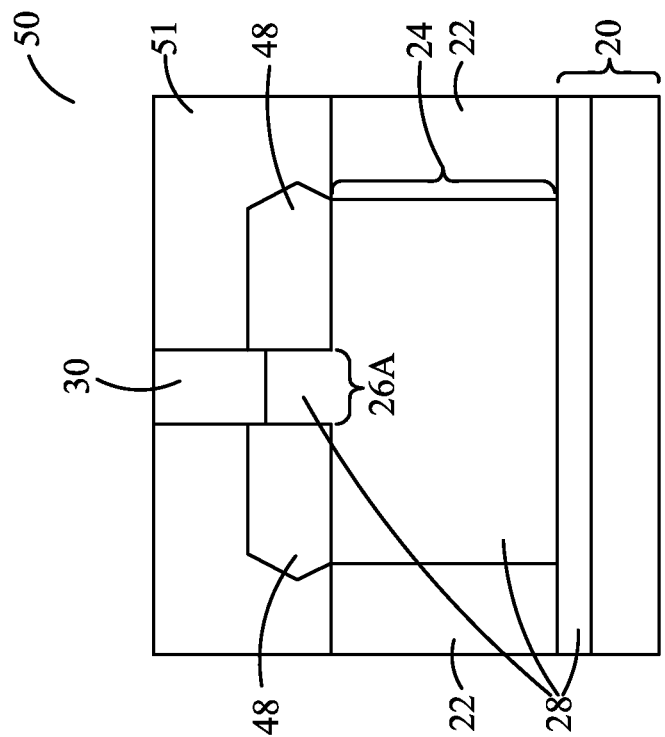

FIGS. 5A and 5B illustrate the epitaxial growth of epitaxy regions 48, which form the source and drain regions of the resulting FinFET 50. The view shown in FIG. 5B is obtained from the plane crossing line 5B-5B in FIG. 5A. Epitaxy regions 48 are formed by selectively growing a semiconductor material in recesses 46 (FIG. 4B). In some exemplary embodiments in which well region 28 is an n-well region, epitaxy regions 48 comprise silicon germanium doped with a p-type impurity such as boron. The resulting FinFET 50 is hence a p-type FinFET. In alternative embodiments in which well region 28 is a p-well region, epitaxy regions 48 comprise silicon doped with an n-type impurity such as phosphorous. The resulting FinFET 50 is hence an n-type FinFET.

In the embodiments wherein gate stack 30 is not a dummy gate stack, source/drain silicide regions, a gate silicide region, an Inter-Layer Dielectric (ILD), and source/drain contact plugs and a gate contact plug (not shown) may be further formed in subsequent process steps. In the alternative embodiments in which gate stack 30 is a dummy gate stack, an ILD (schematically shown in FIG. 5B) may be formed to have a top surface level with the top surface of dummy gate stack 30. Dummy gate stack 30 is then removed, and is replaced by a gate dielectric and a gate electrode (not shown). The respective gate dielectric may include a high-k dielectric material.

In the embodiments of the present disclosure, the profiles of the source and drain regions of the FinFETs may be controlled precisely, sometimes to the accuracy of a mono layer. Accordingly, the etching of the semiconductor fins and the epitaxy re-growth are free from some process variations such as pattern loading effect. Furthermore, since chlorine radicals have a very low etching rate in etching gate stack 30 and STI regions 22 (FIGS. 5A and 5B), the STI loss and gate loss is minimized.

In accordance with some embodiments, a method includes forming a gate stack to cover a middle portion of a semiconductor fin, and doping an exposed portion of the semiconductor fin with an n-type impurity to form an n-type doped region. At least a portion of the middle portion is protected by the gate stack from receiving the n-type impurity. The method further includes etching the n-type doped region using chlorine radicals to form a recess, and performing an epitaxy to re-grow a semiconductor region in the recess.

In accordance with other embodiments, a method includes forming a gate stack to cover a middle portion of a semiconductor fin, and implanting end portions of the semiconductor fin with an n-type impurity to form n-type doped regions on opposite sides of the middle portion. A portion of the middle portion of the semiconductor fin is free from receiving the n-type impurity. The n-type doped regions are etched using chlorine radicals to form a recess, wherein the etching step is stopped when the n-type doped regions are substantially fully removed. The portion of the middle portion the semiconductor fin is exposed when the etching step is stopped. An epitaxy is performed to re-grow a semiconductor region in the recess, wherein the semiconductor region forms a source/drain region of a FinFET.

In accordance with yet other embodiments, a method includes forming a gate stack to cover a middle portion of a semiconductor fin, with the semiconductor fin being higher than top surfaces of shallow trench isolation regions on opposite sides of the semiconductor fin. An end portion of the semiconductor fin is implanted with an n-type impurity to form an n-type doped region. A portion of the middle portion of the semiconductor fin under the gate stack is un-doped or lightly doped with a doping concentration lower than about $1 \times 10^{18}/cm^3$, and forms an un-doped or lightly doped region. The un-doped or lightly doped region adjoins the n-type doped region with doping concentration greater than about $5 \times 10^{19}/cm^3$. The method further includes etching the n-type doped region to form a recess, wherein the etching step stops on the un-doped or lightly doped region. An epitaxy is performed to re-grow a semiconductor region starting from the un-implanted region, wherein the semiconductor region forms a source/drain region of a FinFET.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a gate stack to cover a middle portion of a semiconductor fin;
   doping an exposed portion of the semiconductor fin with an n-type impurity to form an n-type doped region, wherein a portion of the middle portion is protected by the gate stack from receiving the n-type impurity;
   etching the n-type doped region using chlorine radicals to form a recess; and
   performing an epitaxy to re-grow a semiconductor region in the recess.

2. The method of claim 1, wherein the step of doping is performed by implanting the n-type impurity into the exposed portion of the semiconductor fin.

3. The method of claim 1, wherein the n-type doped region has an edge aligned to an edge of the gate stack.

4. The method of claim 1, wherein the n-type doped region extends underlying, and is overlapped by, the gate stack.

5. The method of claim 1, wherein the step of etching is performed in an environment, with substantially no chlorine ions in the environment.

6. The method of claim 1, wherein the n-type doped region is doped to have an n-type impurity concentration higher than about $5 \times 10^{19}/cm^3$, and wherein the method further comprises performing a well doping into the semiconductor fin to a well doping concentration lower than about $1 \times 10^{18}/cm^3$.

7. The method of claim 1, wherein the step of doping the exposed portion of the semiconductor fin comprises implanting arsenic.

8. A method comprising:
   forming a gate stack to cover a middle portion of a semiconductor fin;
   implanting end portions of the semiconductor fin with an n-type impurity to form n-type doped regions on opposite sides of the middle portion, wherein a portion of the middle portion of the semiconductor fin is free from receiving the n-type impurity;
   etching the n-type doped regions using chlorine radicals to form a recess, wherein the etching step is stopped when the n-type doped regions are substantially fully removed, and the portion of the middle portion the semiconductor fin is substantially un-etched; and
   performing an epitaxy to re-grow a semiconductor region in the recess, wherein the semiconductor region forms a source/drain region of a Fin Field-Effect Transistor (FinFET).

9. The method of claim 8, wherein during the step of etching the n-type doped regions, the chlorine radicals are non-uni-directional.

10. The method of claim 8, wherein the step of implanting comprises two tilt implantations tilted in opposite directions, and wherein during the two tilt implantations, the n-type impurity is implanted in directions parallel to planes of edges of the gate stack.

11. The method of claim 8, wherein the step of implanting comprises four tilt implantations tilted in opposite directions, and wherein during the four tilt implantations, the n-type impurity is implanted in directions un-parallel to planes of edges of the gate stack.

12. The method of claim 8, wherein the step of etching is performed in an environment, with substantially no chlorine ions in the environment.

13. The method of claim 8, wherein the step of etching is performed in an environment, with chlorine ions exist in the environment.

14. The method of claim 8, wherein the n-type doped regions are doped to have an n-type impurity concentration higher than about $5 \times 10^{19}/cm^3$.

15. A method comprising:
  forming a gate stack to cover a middle portion of a semiconductor fin, with the semiconductor fin being higher than top surfaces of shallow trench isolation regions on opposite sides of the semiconductor fin;
  implanting an end portion of the semiconductor fin with an n-type impurity to form an n-type doped region, wherein a portion of the middle portion of the semiconductor fin under the gate stack is un-implanted, and forms an un-implanted region, and wherein the un-implanted region adjoins the n-type doped region;
  etching the n-type doped region to form a recess, with chlorine radicals used to etch the n-type doped region, wherein the etching stops on the un-implanted region; and
  performing an epitaxy to re-grow a semiconductor region starting from the un-implanted region, wherein the semiconductor region forms a source/drain region of a Fin Field-Effect Transistor (FinFET).

16. The method of claim 15, wherein the chlorine radicals are non-uni-directional.

17. The method of claim 15 further comprising:
  generate a plasma from a chlorine comprising process gas; and
  filtering the plasma to remove ions, wherein the chlorine radicals are left un-filtered.

18. The method of claim 15, wherein the un-implanted region is of n-type, and is doped to an n-type impurity concentration lower than about $1 \times 10^{18}/cm^3$.

19. The method of claim 15, wherein the step of implanting the end portion of the semiconductor fin comprises implanting arsenic.

20. The method of claim 15, wherein an interface between the n-type doped region and the un-implanted region is overlapped by the gate stack.

\* \* \* \* \*